US007009206B2

(12) United States Patent
Lee et al.

(10) Patent No.: US 7,009,206 B2
(45) Date of Patent: Mar. 7, 2006

(54) THIN FILM TRANSISTOR ARRAY PANEL AND LIQUID CRYSTAL DISPLAY INCLUDING THE PANEL

(75) Inventors: Chang-Hun Lee, Yongin-si (KR); Tae-Hwan Kim, Seoul (KR); Eun-Hee Han, Seoul (KR); Hak-Sun Chang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 56 days.

(21) Appl. No.: 10/855,396

(22) Filed: May 28, 2004

(65) Prior Publication Data

US 2004/0238823 A1    Dec. 2, 2004

(30) Foreign Application Priority Data

May 30, 2003    (KR)    ............... 10-2003-0034677

(51) Int. Cl.
*H01L 29/04* (2006.01)
*H01L 31/036* (2006.01)
*G02F 1/133* (2006.01)

(52) U.S. Cl. ............... 257/72; 257/225; 257/291; 257/292; 349/129

(58) Field of Classification Search .............. 257/72, 257/291–292; 349/129
See application file for complete search history.

(56) References Cited

U.S. PATENT DOCUMENTS

| 6,839,112 B1 * | 1/2005 | Chien et al. ............. 349/129 |
| 6,850,302 B1 * | 2/2005 | Song .................. 349/129 |
| 6,933,528 B1 * | 8/2005 | Itakura et al. ............. 257/72 |

* cited by examiner

*Primary Examiner*—Cuong Nguyen
(74) *Attorney, Agent, or Firm*—McGuireWoods LLP

(57) ABSTRACT

A thin film transistor array panel is provided, which includes: a plurality of gate lines formed on a substrate and including a plurality of oblique portions and a plurality of gate electrodes; a first insulating layer on the gate line; a semiconductor layer formed on the first insulating layer; a plurality of data lines formed at least on the semiconductor layer and intersecting the gate lines to defined trapezoidal pixel areas; a plurality of drain electrodes separated from the data lines; a second insulating layer formed at least on portions of the semiconductor layer that are not covered with the data lines and the drain electrodes; a plurality of pixel electrodes formed on the second insulating layer and connected to the drain electrodes, at least two of the pixel electrodes disposed in each pixel area; and a plurality of common electrodes formed on the second insulating layer, arranged alternate to the pixel electrodes and connected to the drain electrodes, each common electrode having an edge spaced apart from an edge of the pixel electrodes and substantially parallel to the edge of the pixel electrodes.

14 Claims, 17 Drawing Sheets

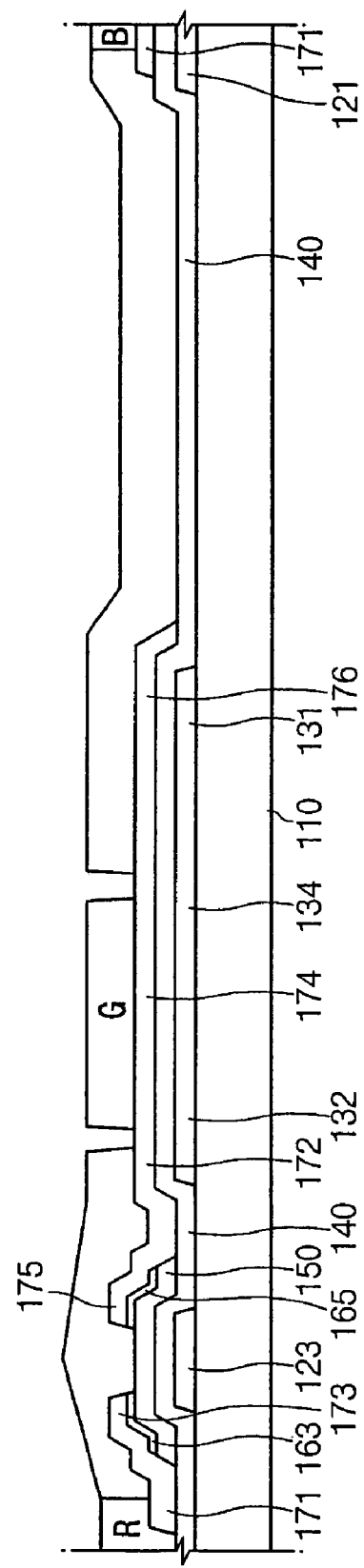

THIN FILM TRANSISTOR ARRAY PANEL AND LIQUID CRYSTAL DISPLAY INCLUDING THE PANEL

BACKGROUND OF THE INVENTION (a) Field of the Invention

The present invention relates to a thin film transistor array panel for a liquid crystal display, and in particular, to a thin film transistor array panel including two kind of field-generating electrodes for generating horizontal electric field.

(b) Description of the Related Art

A conventional art for driving liquid crystal by using horizontal electric field is disclosed in U.S. Pat. No. 5,598,285.

A liquid crystal display (LCD) disclosed in U.S. Pat. No. 5,598,285 includes pixel electrodes and common electrodes for generating horizontal electric field. The LCD has a problem that the behaviors of the liquid crystal molecules are distorted near top and bottom portions of a pixel, where the common electrodes and a storage electrode line connected to the common electrodes for transmitting a common signal are adjacent to each other. The distortion may be covered by widening a black matrix, but it reduces the aperture ratio.

In addition, there is a problem that the coupling between a data line for applying voltages to the pixel electrodes and the pixel electrodes or the common electrodes parallel to the data line distorts the liquid crystal driving to cause light leakage and crosstalk. This problem may be solved by widening the common electrodes adjacent to the data line, but it also reduces the aperture ratio.

Furthermore, it is difficult to increase the number of the electrodes since the common electrodes and the pixel electrodes extend parallel to the data line, i.e., parallel to long edges of a pixel defined by gate lines and the data lines.

SUMMARY OF THE INVENTION

A thin film transistor array panel is provided, which includes: a plurality of gate lines formed on a substrate and including a plurality of oblique portions and a plurality of gate electrodes; a first insulating layer on the gate line; a semiconductor layer formed on the first insulating layer; a plurality of data lines formed at least on the semiconductor layer and intersecting the gate lines to defined trapezoidal pixel areas; a plurality of drain electrodes separated from the data lines; a second insulating layer formed at least on portions of the semiconductor layer that are not covered with the data lines and the drain electrodes; a plurality of pixel electrodes formed on the second insulating layer and connected to the drain electrodes, at least two of the pixel electrodes disposed in each pixel area; and a plurality of common electrodes formed on the second insulating layer, arranged alternate to the pixel electrodes and connected to the drain electrodes, each common electrode having an edge spaced apart from an edge of the pixel electrodes and substantially parallel to the edge of the pixel electrodes.

The gate lines may be curved near boundaries of the pixel areas.

The common electrodes and the pixel electrodes may extend substantially parallel to the oblique portions of the gate lines.

The thin film transistor array panel may further include a plurality of storage electrode lines having a plurality of first portions extending substantially parallel to the data lines.

The thin film transistor array panel may further include a plurality of signal lines overlapping the storage electrode lines to form storage capacitors.

The pixel electrodes and the common electrodes may include transparent material.

The thin film transistor array panel may further include a plurality of color filters disposed under the passivation layer and in the pixel areas.

A liquid crystal display is provided, which includes: a first panel; a second panel facing the first panel; and a liquid crystal layer interposed between the first panel and the second panel. The first panel includes: a plurality of gate lines formed on a substrate and including a plurality of oblique portions and a plurality of gate electrodes; a first insulating layer on the gate line; a semiconductor layer formed on the first insulating layer; a plurality of data lines formed at least on the semiconductor layer and intersecting the gate lines to defined trapezoidal pixel areas; a plurality of drain electrodes separated from the data lines; a second insulating layer formed at least on portions of the semiconductor layer that are not covered with the data lines and the drain electrodes; a plurality of pixel electrodes formed on the second insulating layer and connected to the drain electrodes, at least two of the pixel electrodes disposed in each pixel area; and a plurality of common electrodes formed on the second insulating layer, arranged alternate to the pixel electrodes and connected to the drain electrodes, each common electrode having an edge spaced apart from an edge of the pixel electrodes and substantially parallel to the edge of the pixel electrodes.

The liquid crystal display may further include a sealant disposed around the second panel and confining the liquid crystal layer.

The liquid crystal display may further include a light blocking member located within the sealant and defining a display area for displaying images.

The light blocking member may include organic material and it is patterned by photolithography.

The liquid crystal display may further include a plurality of spacers including the same layer as the light blocking member.

The spacers may have a height different from the light blocking member.

The light blocking member may have a plurality of depressions.

BRIEF DESCRIPTION OF THE DRAWINGS

The present invention will become more apparent by describing embodiments thereof in detail with reference to the accompanying drawings in which:

FIGS. 5B, 6B, 7B, 8B and 9B are sectional views of the TFT array panel shown in

FIGS. 5A, 6A, 7A, 8A and 9A taken along the lines VB–VB', VIB–VIB', VIIB–VIIB', VIIIB–VIIIB', IX–IX', respectively;

DETAILED DESCRIPTION OF PREFERRED EMBODIMENTS

Figure 1:
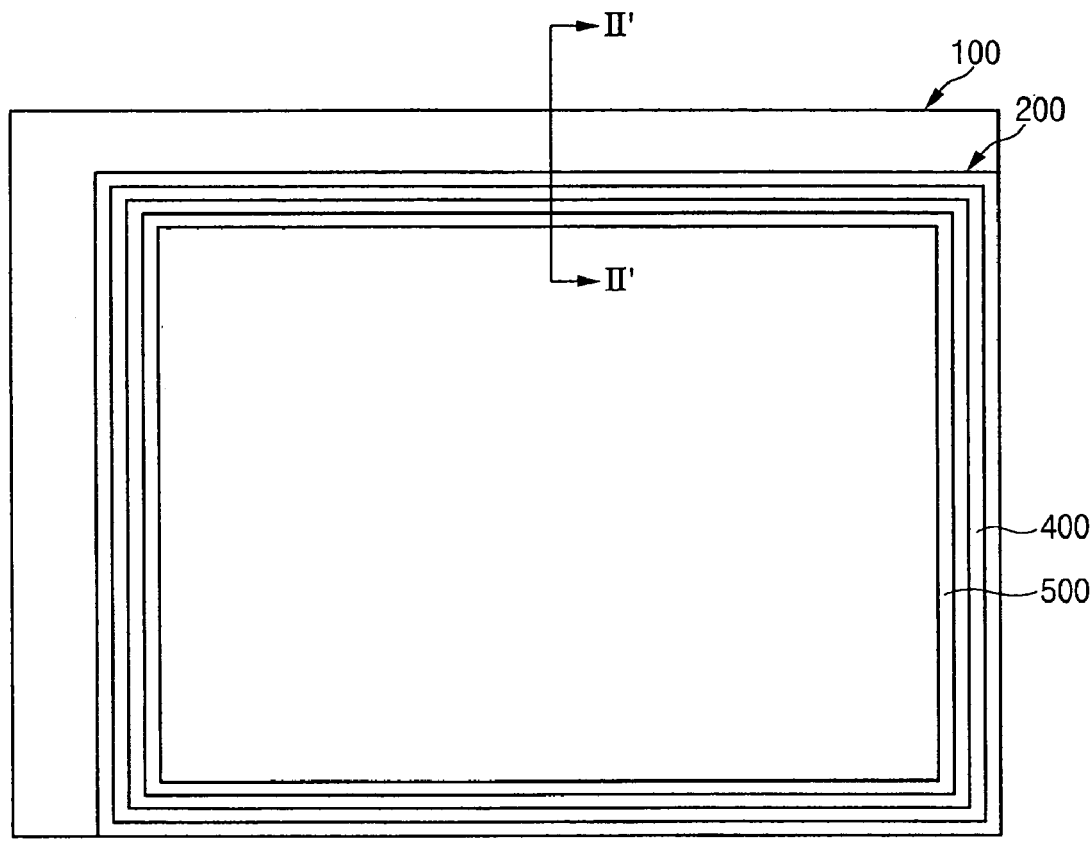
FIG. 1 is a schematic plan view of an LCD according to an embodiment of the invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, liquid crystal displays (LCDs) and thin film transistor (TFT) array panels therefor according to embodiments of the present invention will be described with reference to the accompanying drawings.

An LCD according to an embodiment of the invention is described in detail with reference to FIGS. 1 and 2.

Figure 2:
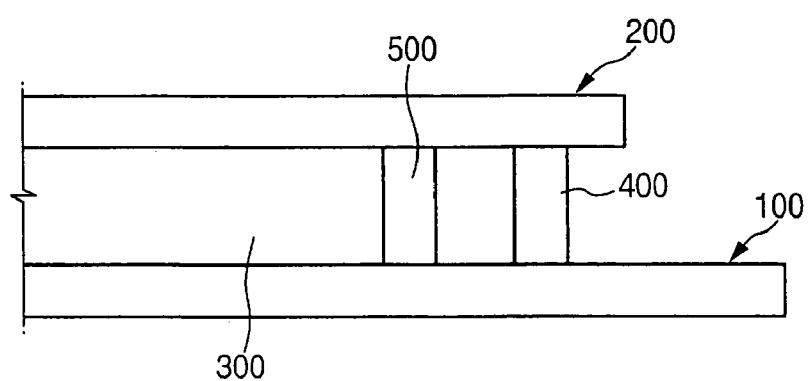
FIG. 2 is a sectional view of the LCD shown in FIG. 1 taken along the line II–II'.

FIG. 1 is a schematic plan view of an LCD according to an embodiment of the invention, and FIG. 2 is a sectional view of the LCD shown in FIG. 1 taken along the line II–II'.

Referring to FIGS. 1 and 2, an LCD according to an embodiment of the invention includes lower and upper panels 100 and 200 facing each other and interposing a gap therebetween, a liquid crystal layer 300 filled in the gap between the lower panel 100 and the upper panel 200 and including a plurality of liquid crystal molecules that are aligned substantially parallel to surfaces of the panels 100 and 200, a sealant 400 interposed between the lower panel 100 and the upper panel 200 and sealing the liquid crystal layer, and a light blocking layer 500 (which is called a "black matrix") disposed within the sealant 400, defining a display area displaying images, and blocking light leakage around the display area. The light blocking layer 500 is preferably made of organic material and it may have a function of a spacer sustaining the gap between the panels 100 and 200.

When manufacturing the LCD, the light blocking layer 500 and the sealant 400 are formed on the upper panel 200, which is also called an opposite panel, and a plurality of signal lines and a plurality of TFTs are formed on the lower panel 100, which is also called a TFT array panel. Both or either of the light blocking layer 500 and the sealant 400 may be is formed on the TFT array panel 100.

In detail, a plurality of gate lines and a plurality of data lines defining a plurality of pixel areas having a shape of trapezoid are provided on the TFT array panel 100 and a plurality of pixel electrodes and common electrodes are aligned in parallel to each other. A plurality of storage electrode lines connected to the common electrodes extend parallel to the data lines and to the long edges of the pixel areas. Liquid crystal molecules are aligned perpendicular to the data lines and the common signals lines in absence of electric field, and the gate lines include a plurality of transverse portions intersecting the data lines and a plurality of oblique portions extending parallel to the common electrodes.

First, a TFT array panel for an LCD according to a first embodiment of the present invention is now described with reference to FIGS. 3 and 4.

Figure 3:
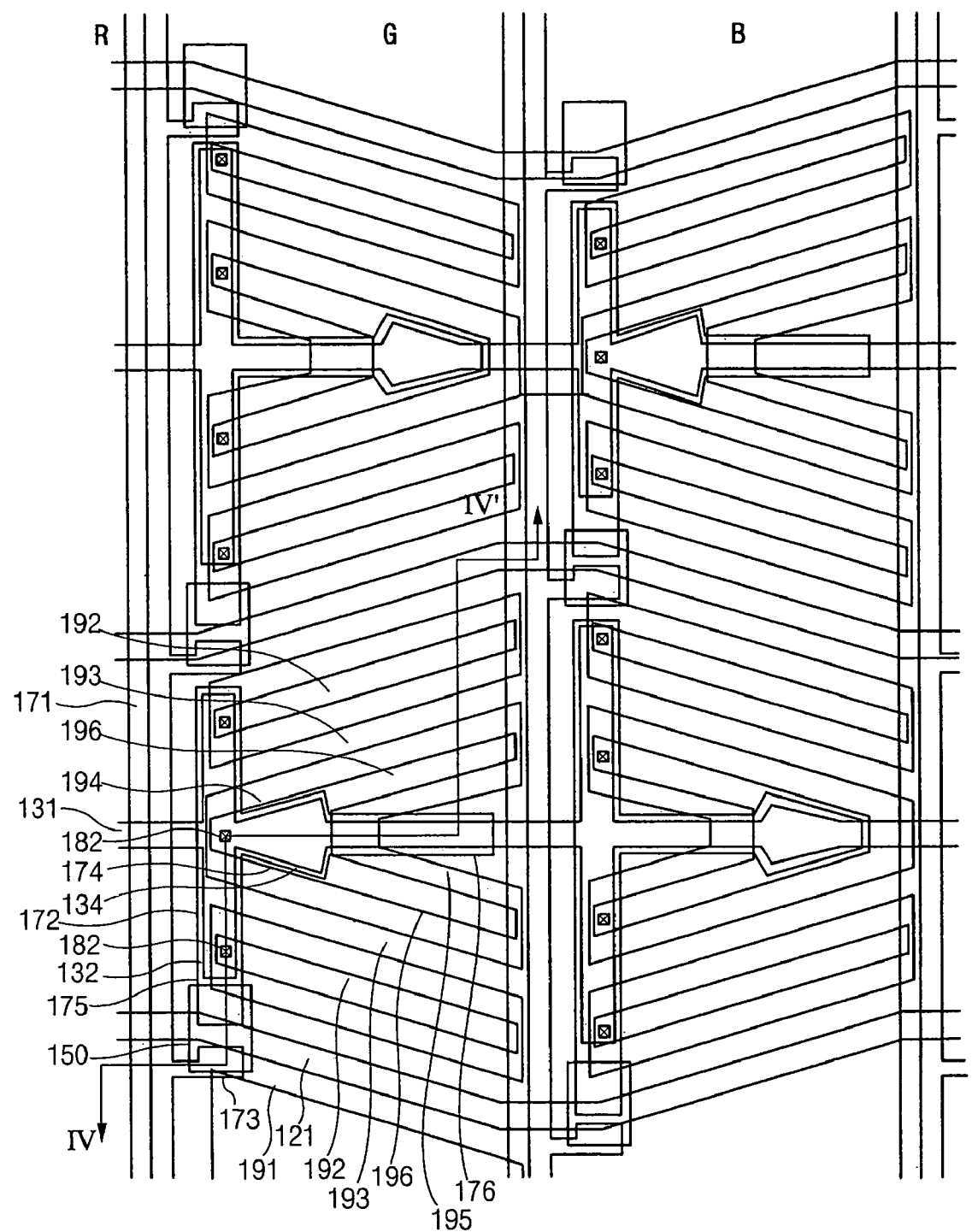
FIG. 3 is a schematic layout view of a pixel in a TFT array panel for an LCD according to an embodiment of the present invention.
Figure 4:
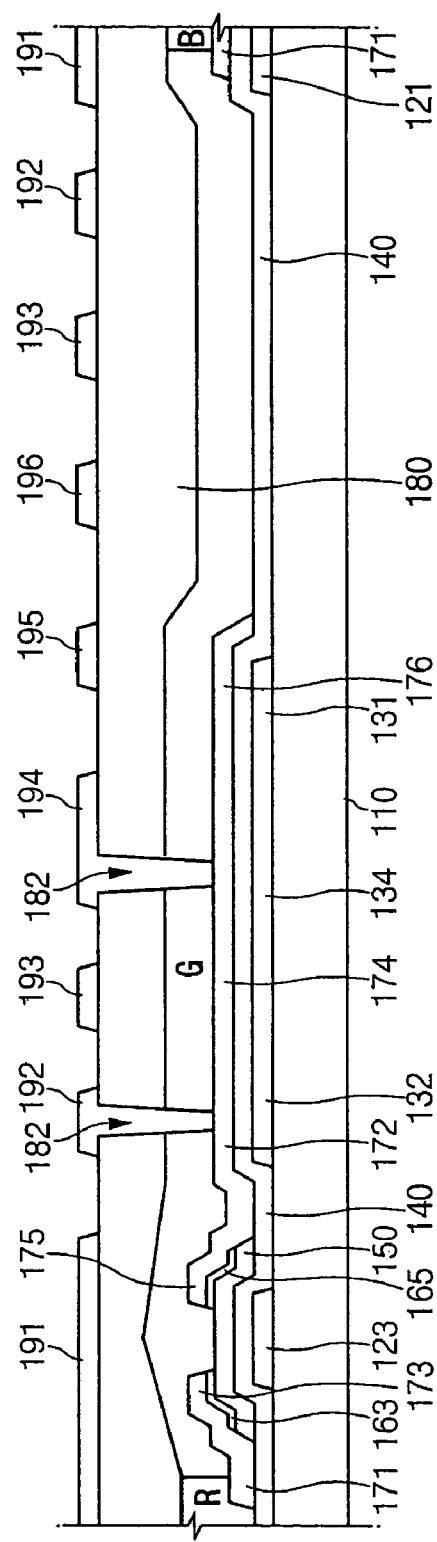
FIG. 4 is a sectional view of the TFT array panel shown in FIG. 3 taken along the is line IV–IV'.

FIG. 3 is a schematic layout view of a pixel in a TFT array panel for an LCD according to an embodiment of the present invention, and FIG. 4 is a sectional view of the TFT array panel shown in FIG. 3 taken along the line IV–IV'.

Referring to FIGS. 3 and 4, a plurality of gate lines 121 and a plurality of storage electrode lines 131 separated from the gate lines 121 are formed on an insulating substrate 110.

The gate lines 121 for transmitting gate signals extend substantially in a transverse direction and are separated from each other. A plurality of portions of each gate line 121 form gate electrodes 123, but the gate electrodes 123 may be branched from the gate lines 121. Each gate line 121 includes a plurality of oblique portions and a plurality of transverse portions connected alternately. The oblique portions include rising portions and falling portions from the left to the right and they are alternately arranged in the transverse direction and a longitudinal direction. Each gate line 121 may include an end portion (not shown) for contact with another layer or an external device. The gate electrodes 123 may be branched from the gate lines 121.

Each storage electrode line 131 extends substantially in the transverse direction and it is substantially equidistant from adjacent two gate lines 121. Each storage electrode line 131 includes a plurality of longitudinal branches 132 extending upward and downward and a plurality of expansions 134 having large areas. Each expansion 134 has a rising edge and a falling edge from the left to the right, which are substantially parallel to the rising portions and the falling portions of the gate lines 121. The rising edges face the rising portions of the gate lines 121 and the falling edges face the falling portions of the gate lines 121. The storage electrode lines 131 are supplied with a predetermined voltage such as a common voltage.

The gate lines 121 and the storage electrode lines 131 are preferably made of Al and Al alloy, Ag containing metal such as Ag and Ag alloy, Cu containing metal such as Cu and Cu alloy, Cr, Mo, Mo alloy, Ta, or Ti. They may have a multi-layered structure. The gate lines 121 and the storage electrode lines 131 may include two films having different physical characteristics, a lower film and an upper film. The upper film are preferably made of low resistivity metal including Al containing metal such as Al and Al alloy for reducing signal delay or voltage drop in the gate lines 121 and the storage electrode lines 131. On the other hand, the lower film is preferably made of material such as Cr, Mo, Mo alloy, Ta and Ti, which has good physical, chemical, and electrical contact characteristics with other materials such as indium tin oxide (ITO) and indium zinc oxide (IZO). A good exemplary combination of the lower film material and the upper film material is Cr and Al—Nd alloy.

In addition, the lateral sides of the gate lines 121 and the storage electrode lines 131 are inclined relative to a surface of the substrate 110, and the inclination angle thereof ranges about 20–80 degrees.

A gate insulating layer 140 preferably made of silicon nitride (SiNx) is formed on the gate lines 121 and storage electrode lines 131.

A plurality of semiconductor islands 150 preferably made of hydrogenated amorphous silicon (abbreviated to "a-Si") or polysilicon are formed on the gate insulating layer 140 and disposed opposite the gate electrodes 123. A plurality of pairs of ohmic contacts 163 and 165 preferably made of silicide or n+ hydrogenated a-Si heavily doped with n type impurity are formed on the semiconductor islands 150. Each pair of ohmic contacts 163 and 165 are located on the semiconductor islands 150. The semiconductor islands 150 and the ohmic contacts 163 may extend in the longitudinal direction.

The lateral sides of the semiconductor islands 151 and the ohmic contacts 163 and 165 are inclined relative to a surface of the substrate 110, and the inclination angles thereof are preferably in a range between about 30–80 degrees.

A plurality of data lines 171 and a plurality of drain electrodes 175 are formed on the ohmic contacts 163 and 165 and the gate insulating layer 140.

The data lines 171 transmitting data voltages extend substantially in the longitudinal direction and intersect the gate lines 121 to define the trapezoidal pixel areas. Each data line 171 may include an end portion (not shown) for contact with another layer or an external device.

A plurality of branches of each data line 171 extend onto the ohmic contacts 163 to form a plurality of source electrodes 173 facing end portions of the drain electrodes 175. Each pair of the source electrodes 173 and the drain electrodes 175 are separated from each other and opposite each other with respect to a gate electrode 123. A gate electrode 123, a source electrode 173, and a drain electrode 175 along with a semiconductor island 154 form a TFT having a channel formed in the semiconductor island 150 disposed between the source electrode 173 and the drain electrode 175.

Each drain electrode 175 includes a longitudinal portion 172 extending from an ohmic contact 165 in the longitudinal direction to overlap a branch 132 of a storage electrode line 131 and a transverse portion 176 extending in the transverse direction to overlap the storage electrode lines 131. The transverse portion 176 has an expansion 174 overlapping an expansion 134 of a storage electrode line 131 and having substantially the same planar shape as the expansion 134.

The data lines 171 and the drain electrodes 175 are preferably made of refractory metal such as Cr, Mo, Mo alloy, Ta or Ta. They may include a lower film preferably made of Mo, Mo alloy or Cr and an upper film located thereon and preferably made of Al containing metal or Ag containing metal.

Like the gate lines 121 and the storage electrode lines 131, the data lines 171 and the drain electrodes 175 have tapered lateral sides relative to the surface of the substrate 110, and the inclination angles thereof range about 30–80 degrees.

The ohmic contacts 163 and 165 are interposed only between the underlying semiconductor islands 150 and the overlying data lines 171 and the overlying drain electrodes 175 thereon and reduce the contact resistance therebetween. The semiconductor islands 150 include a plurality of exposed portions, which are not covered with the data lines 171 and the drain electrodes 175, such as portions located between the source electrodes 173 and the drain electrodes 175.

A plurality of red, green and blue color filters R, G and B is formed on the data lines 171, the drain electrodes 175, and the exposed portions of the semiconductor stripes 151. Each of the color filters R, G and B are disposed substantially between adjacent two the data lines 171 and extends in a longitudinal direction. The color filters R, G and B are not disposed on a peripheral area which is provided with the end portions of the gate lines 121 and the data lines 171. Although FIG. 4 shows that edges of adjacent color filters R, G and B exactly match each other, the color filters R, G and B may be spaced apart from each other. The color filters R, G and B may overlap each other on the data lines 171 to block the light leakage and, in this case, their edges are preferably inclined relative to the surface of the substrate.

An interlayer insulating layer (not shown) preferably made of inorganic insulating material such as silicon oxide or silicon nitride may be disposed under the color filters R, G and B.

A passivation layer 180 is formed on the color filters R, G and B. The passivation layer 180 is preferably made of silicon nitride or organic material having a good flatness characteristic.

The passivation layer 180 and the color filters R, G and B have a plurality of triple contact holes 182 exposing the longitudinal portions 172 of the drain electrodes 175. In addition, the passivation layer 180 and the color filters R, G and B may have a plurality of contact holes (not shown) exposing the end portions of the gate lines 121 and the data lines 171.

A plurality of pixel electrodes 192 and 194 and a common electrode net including a plurality of longitudinal stems and a plurality of common electrodes 191, 193 and 195 connected to at least one of adjacent longitudinal stems are formed on the passivation layer 180. The pixel electrodes 192 and 194 and the common electrode net may be made of transparent conductive material such as ITO and IZO in order to increase the transmittance of light.

The pixel electrodes 192 and 194 are physically and electrically connected to the longitudinal portions of the drain electrodes 175 through the contact holes 182 such that the pixel electrodes 190 receive the data voltages from the drain electrodes 175. Each pixel electrode 194 overlaps an expansion 134 of a storage electrode line 131 as well as an expansion 174 of a drain electrode 175 and includes two branches 196 extending substantially parallel to the rising edge and the falling of the expansion 134, respectively. (For descriptive convenience, the branches 196 are also referred to as pixel electrodes.) Each pixel electrode 192 that is substantially rectilinear is disposed between an oblique portion of a gate line 121 and a pixel electrode 196 and extends substantially parallel thereto.

Each common electrode 195 is connected to one longitudinal stem and overlaps a storage electrodes line 131. The common electrode 195 is disposed between the branches 196 of a pixel electrode 194 and has a rising edge and a falling edge parallel to the branches 196. Each common electrode 191 is connected to adjacent longitudinal stems and covers an oblique portion of a gate line 121 such that both edges of the common electrode 191 are disposed opposite each other with respect to the gate line 121 and extend parallel to the oblique portion. Each common electrode 193, which is substantially rectilinear, is disposed between adjacent pixel electrodes 192 and 196 and extends substantially parallel thereto.

Accordingly, the common electrodes 191, 193 and 195 and the pixel electrodes 192 and 196 are alternately arranged and edges of the common electrodes 191, 193 and 195 and the pixel electrodes 192 and 196 are substantially parallel to each other.

The pixel electrodes 192 and 196 connected to a drain electrode 175 and the common electrodes 191, 193 and 195 adjacent thereto form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 192 and 194 with the storage electrode lines 131. The capacitances of the storage capacitors, i.e., the storage capacitances are increased by extending and overlapping the drain electrodes 175, which are connected to and located under the pixel electrodes 192 and 194, to/with the storage electrode lines 131 for decreasing the distance between the terminals and by providing the expansions at the drain electrodes 175 and the storage electrode lines 131 for increasing overlapping areas.

A plurality of contact assistants (not shown) may be formed on the passivation layer 180 and they may be connected to the end portions of the gate lines 121 and the data lines 171 through the contact holes provided at the passivation layer 180 and the color filters R, G and B.

An alignment layer (not shown) for aligning liquid crystal molecules is formed on the passivation layer 180. The alignment layer may be rubbed preferably in a direction perpendicular to the data lines 171.

The common electrodes 191, 193 and 195 and the pixel electrodes 192 and 194 may be formed of the same layer as the gate lines 121 and the data lines 171, respectively. The common electrode 191, 193 and 195 and the pixel electrodes 192 and 196 preferably have thickness equal to or less than about 2,000 Å for preventing alignment defect due to height difference.

In the TFT array panel for an LCD according to this embodiment of the present invention, the color filters R, G and B and the passivation layer 180 made of low dielectric organic material and interposed between the electrodes 191, 192, 193, 196 and 195 and the gate lines 121 and the data lines 171 weaken the lateral field therebetween and thus the electrodes 191, 192, 193, 196 and 195 can overlap the gate lines 121 and the data lines 171 to increase the aperture ratio.

In addition, the color filters R, G and B disposed on the TFT array panel 100 can reduce the alignment margin to prevent the reduction of the aperture ratio.

Moreover, the longitudinal branches 132 of the storage electrode lines 131 extend parallel to the data lines 171 along long edges of the pixel areas and the rubbing direction is determined such that the liquid crystal molecules are aligned perpendicular to the data lines 171 in absence of electric field. Accordingly, an electric field generated by the voltage difference between the data lines 171 and the longitudinal branches 132 of the storage electrode lines 131 makes the liquid crystal molecules be in their initial orientations and the corresponding areas are displayed dark to prevent lateral crosstalk.

In addition, the number of the electrodes 191, 192, 193, 196 and 195 can be easily adjusted since the common electrodes 191, 193 and 195 and the pixel electrodes 192 and 196 are arranged in a long edge direction of the pixel areas unlike the conventional art.

Furthermore, the effective display area can be enlarged to corners of the pixel areas since the pixel electrodes and the common electrodes located near the edges of the pixel areas extend parallel to the edges of the pixel areas defined by the gate lines 121 and the data lines 171. Moreover, the storage capacitors located near the centers of the pixel areas, where the textures are generated to deteriorate image quality, prevent the reduction of the transmittance of the pixel areas to maximize the transmittance of the pixel areas.

A method of manufacturing the TFT array panel shown in FIGS. 3 and 4 according to an embodiment of the present invention will be now described in detail with reference to FIGS. 5A to 9B as well as FIGS. 3 and 4.

FIGS. 5A, 6A, 7A, 8A and 9A are layout views of the TFT array panel shown in FIGS. 3 and 4 in intermediate steps of a manufacturing method thereof according to an embodiment of the present invention, and FIGS. 5B, 6B, 7B, 8B and 9B are sectional views of the TFT array panel shown in FIGS. 5A, 6A, 7A, 8A and 9A taken along the lines VB–VB', VIB–VIB', VIIB–VIIB', VIIIB–VIIIB', IX–IX', respectively.

Figure 5A:
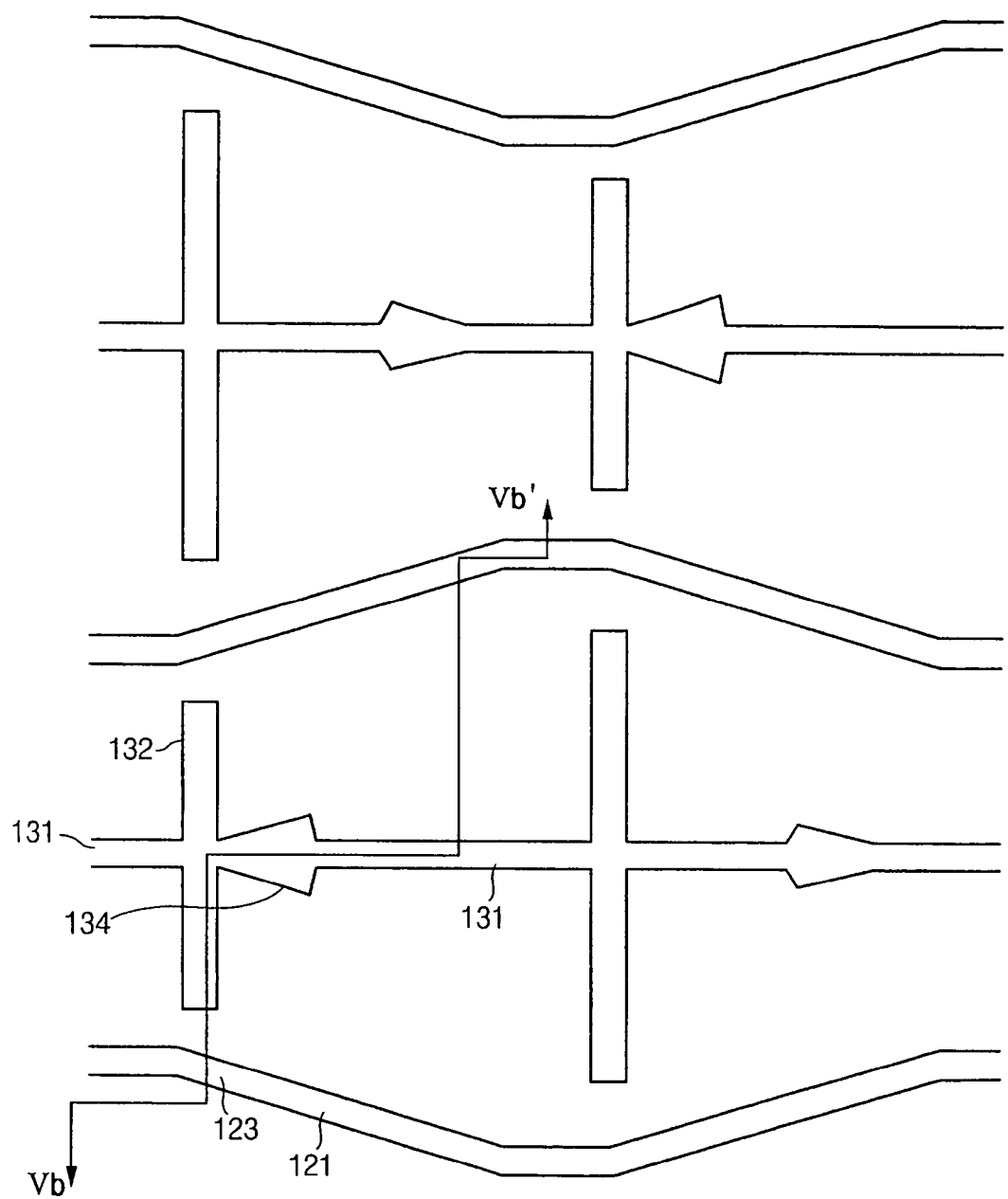
FIGS. 5A, 6A, 7A, 8A and 9A are layout views of the TFT array panel shown in FIGS. 3 and 4 in intermediate steps of a manufacturing method thereof according to an embodiment of the present invention.
Figure 5B:
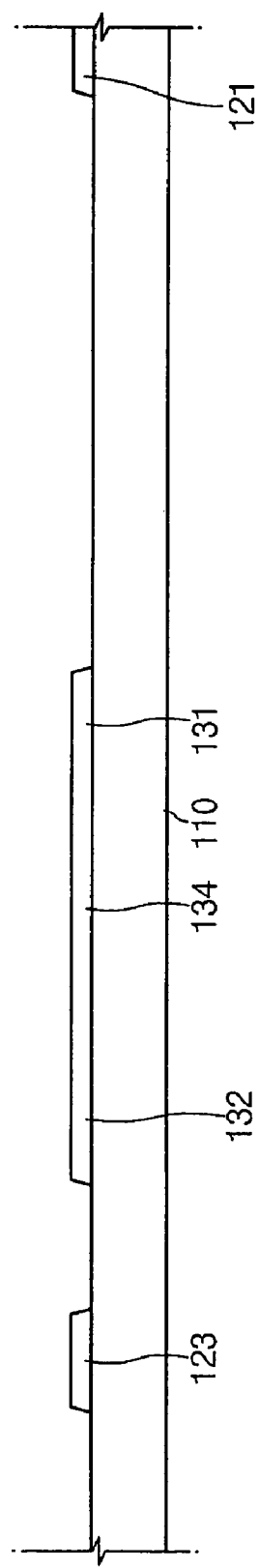

Referring to FIGS. 5A and 5B, a plurality of gate lines 121 including a plurality of gate electrodes 123 and a plurality of storage electrode lines 131 including a plurality of longitudinal branches 132 and expansions 134 are formed on an insulating substrate 110 by photo-etching.

Figure 6A:
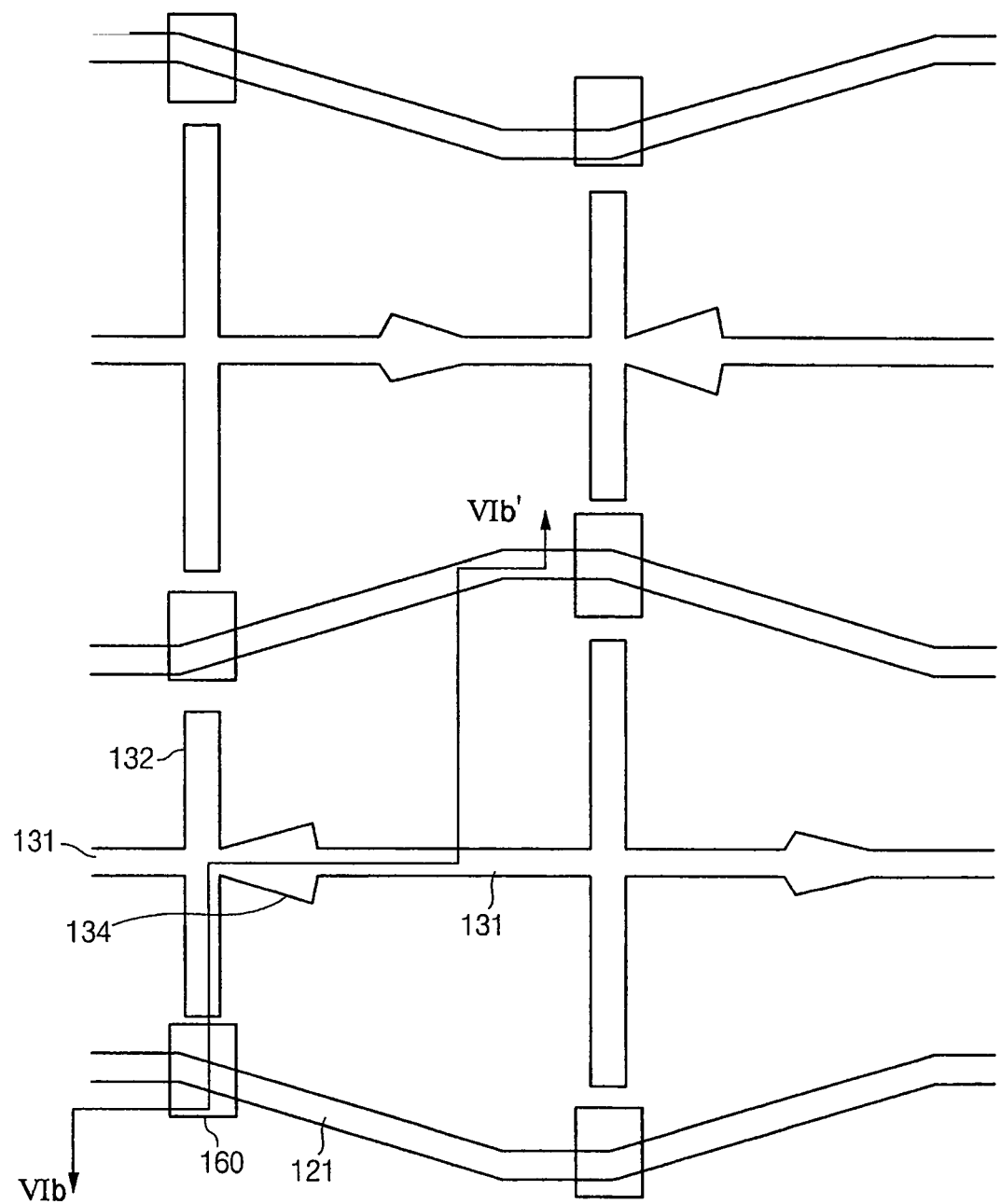
Figure 6B:
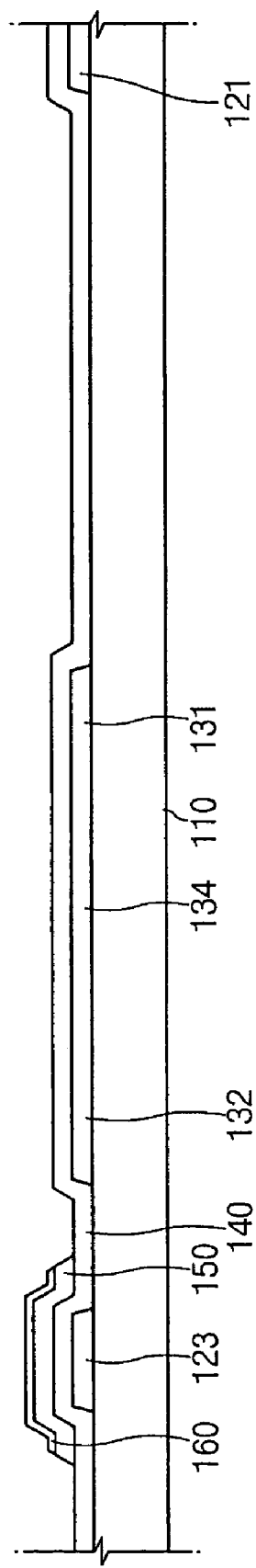

Referring to FIGS. 6A and 6B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor islands 160 and a plurality of intrinsic semiconductor islands 150 on the gate insulating layer 140.

Figure 7A:
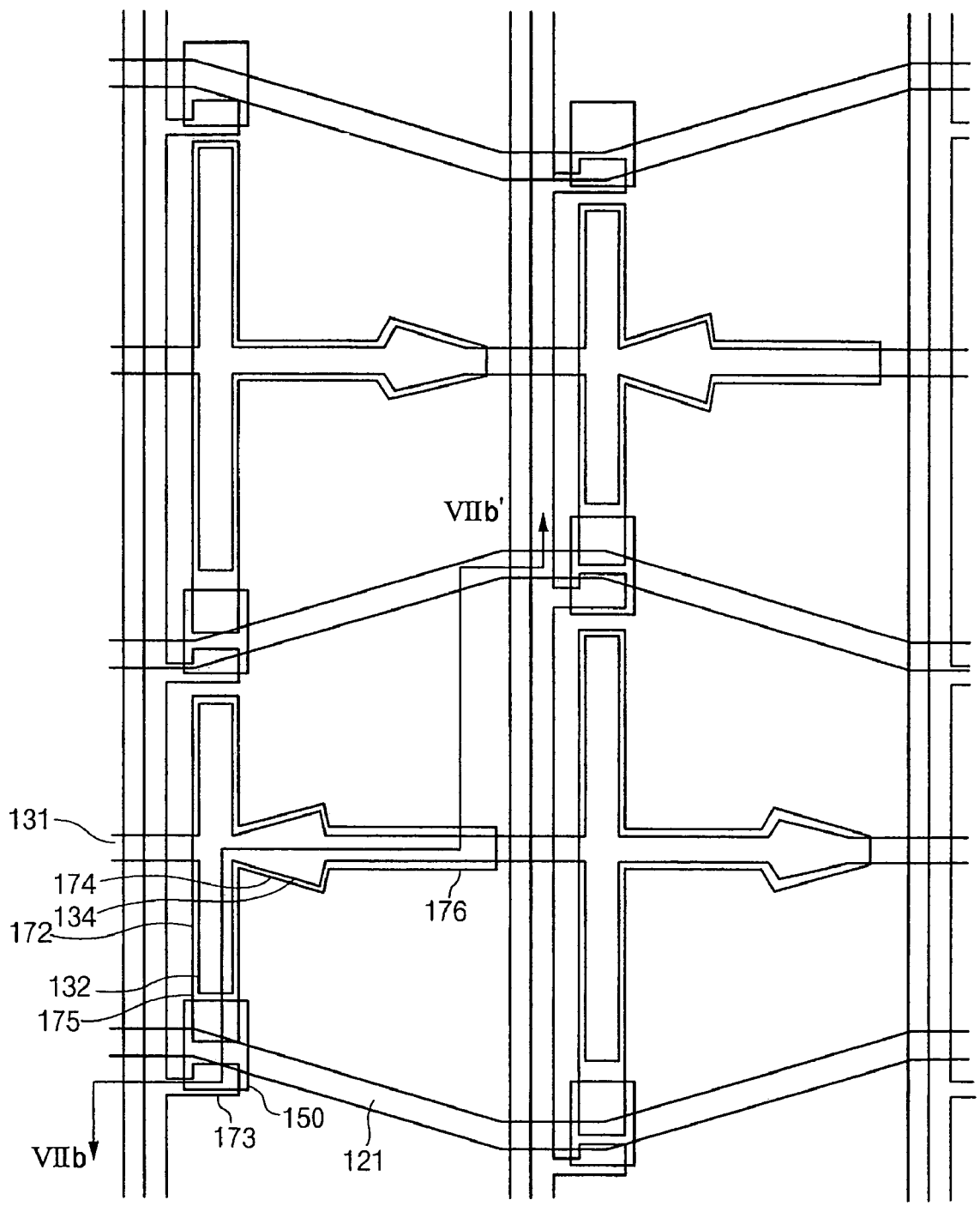
Figure 7B:
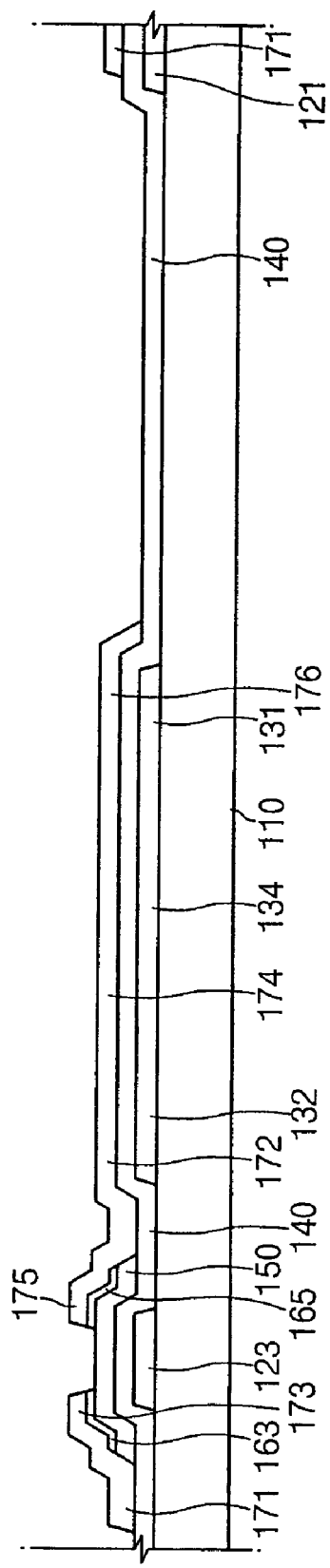

Referring to FIGS. 7A and 7B, a plurality of data lines 171 including a plurality of source electrodes 173 and a plurality of drain electrodes 175 including a plurality of longitudinal portions 172 and transverse portions 176 having expansions 174 are formed by photo etching.

Thereafter, portions of the extrinsic semiconductor islands 160, which are not covered with the data lines 171 and the drain electrodes 175 are removed to complete a plurality of ohmic contact islands 163 and 165 and to expose portions of the intrinsic semiconductor islands stripes 150. Oxygen plasma treatment preferably follows thereafter in order to stabilize the exposed surfaces of the semiconductor islands 150.

Figure 8A:
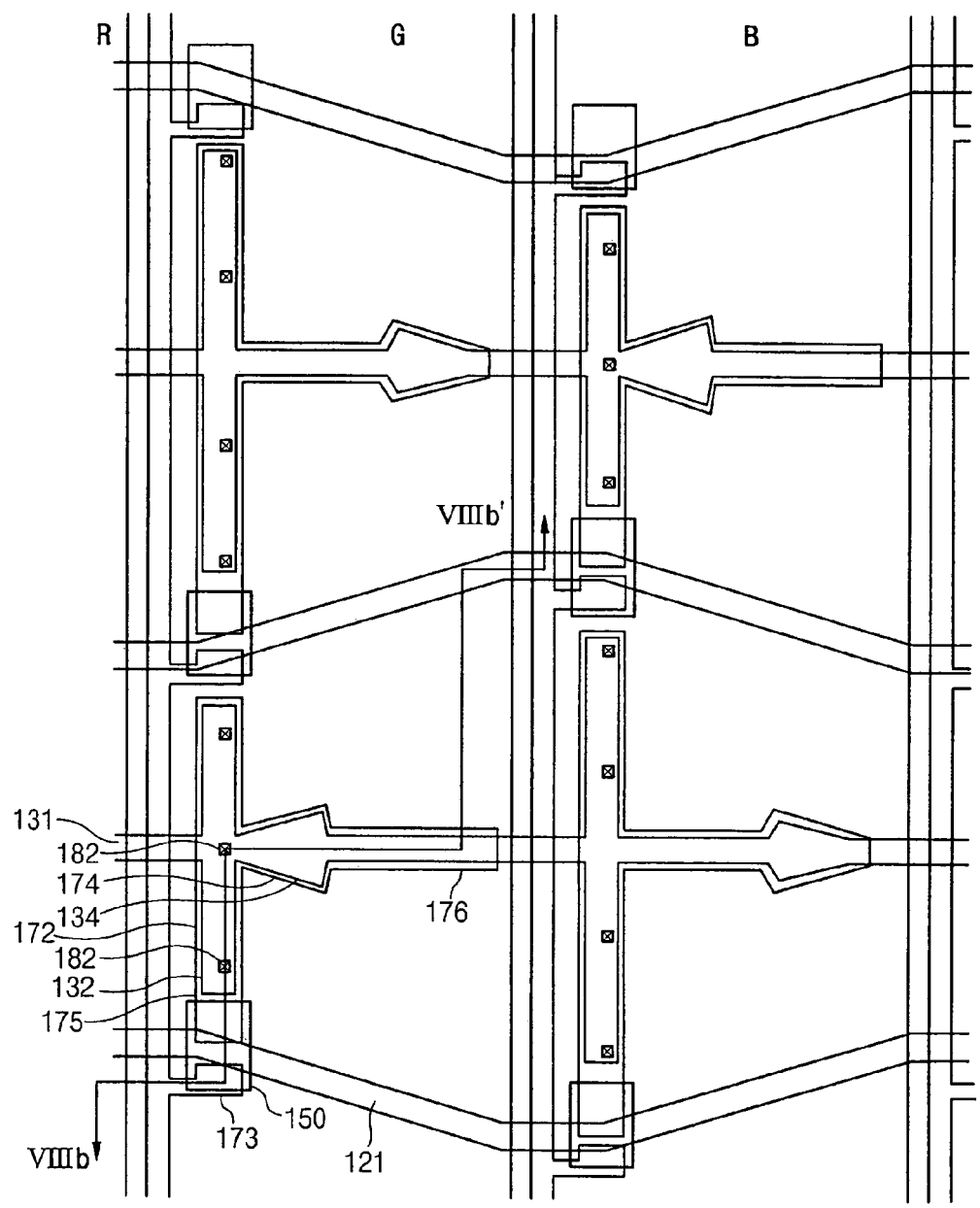
Figure 9A:
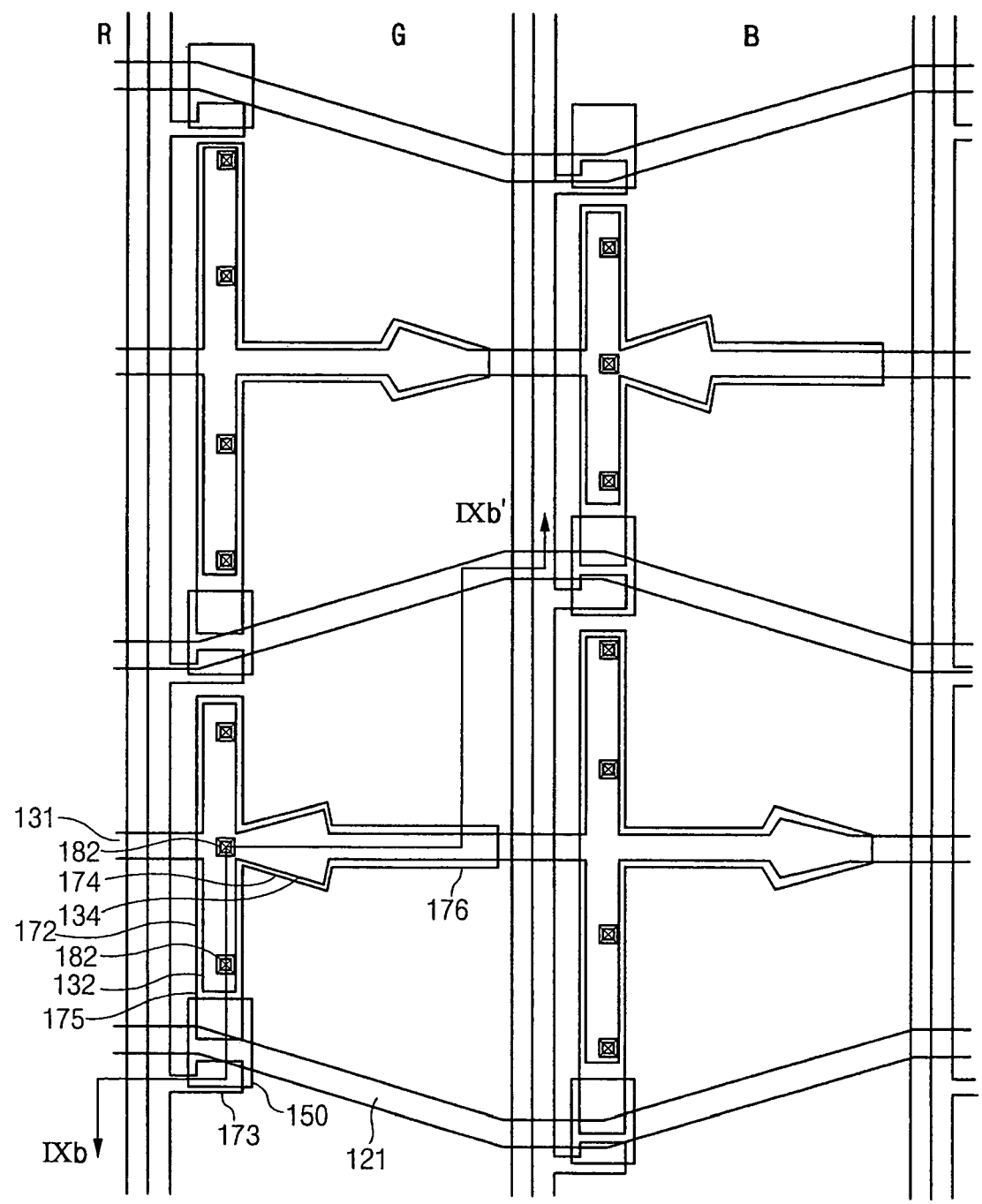
Figure 9B:
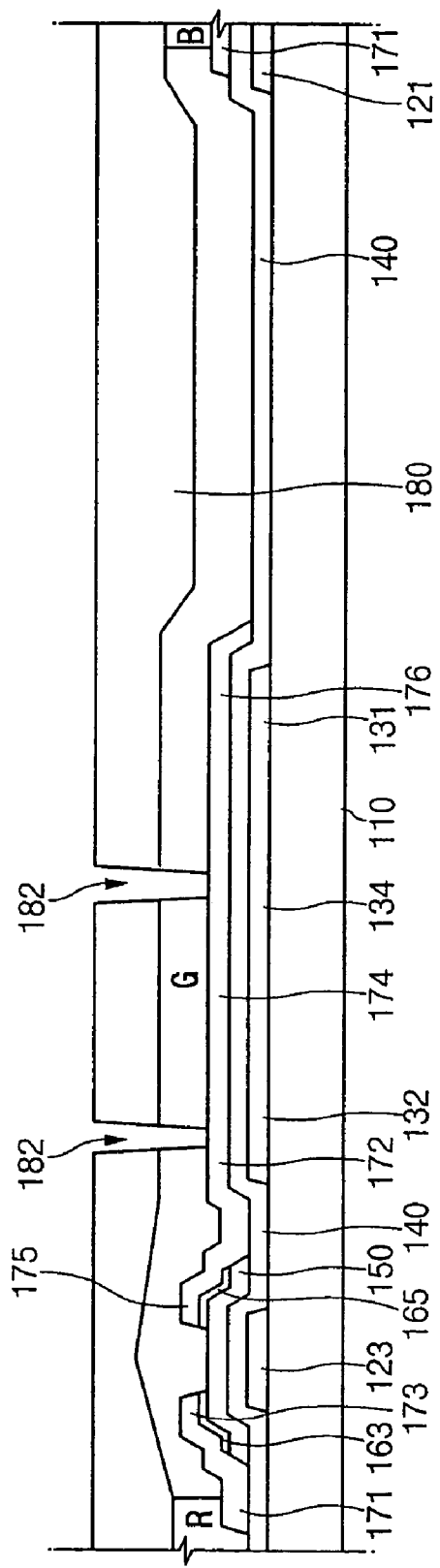

As shown in FIGS. 8A and 8B, an interlayer insulating layer (not shown) is formed and photosensitive films including red, green and blue pigments are coated and patterned in sequence to form a plurality of red, green, and blue color filters R, G, and B having openings exposing the longitudinal portions 172 of the drain electrodes 175. A passivation layer 180 is deposited and patterned along with the interlayer insulating layer and the gate insulating layer 140 to form a plurality of contact holes 182 having slanted sidewalls.

Finally, as shown in FIGS. 3 and 4, a plurality of pixel electrodes 192 and 194, a common electrode net including the common electrodes 191, 193 and 195, and a plurality of contact assistants (not shown) are formed on the passivation layer 180 by depositing and photo-etching an ITO or IZO layer having a thickness of about 400 Å–500 Å.

A TFT array panel for an LCD according to another embodiment of the present invention will be described in detail with reference to FIG. 10.

Figure 10:
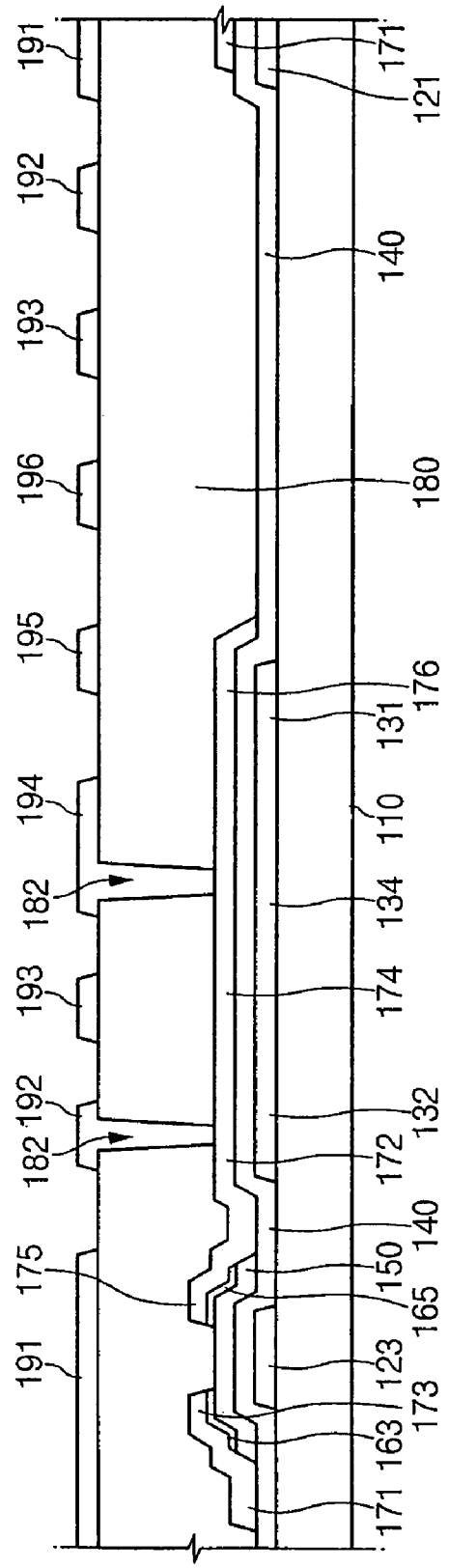
FIG. 10 is a sectional view of an exemplary TFT array panel for an LCD according to another embodiment of the present invention.

FIG. 10 is a sectional view of an exemplary TFT array panel for an LCD according to another embodiment of the present invention.

As shown in FIG. 10, a layered structure of a TFT array panel of an LCD according to this embodiment is almost the same as that shown in FIG. 4. That is, a plurality of gate lines 121 including a plurality of gate electrodes 123 and a plurality of storage electrodes lines 131 including a plurality of longitudinal branches 132 and expansions 134 are formed on a substrate 110, and a gate insulating layer 140, a plurality of semiconductor islands 150, and a plurality of ohmic contact islands 163 and 165 are sequentially formed thereon. A plurality of data lines 171 including a plurality of source electrodes 173 and a plurality of drain electrodes 175 including a plurality of longitudinal and transverse portions 172 and 176 having expansions 174 are formed on the ohmic contacts 163 and 165, and a passivation layer 180 is formed thereon. A plurality of contact holes 182 are provided at the passivation layer 180 and the gate insulating layer 140, and a plurality of pixel electrodes 192 and 194 and a common electrode net including a plurality of common electrodes 191, 193 and 195 are formed on the passivation layer 180.

Different from the TFT array panel shown in FIG. 4, the TFT array panel according to this embodiment includes no color filter. The color filters may be provided on an opposite panel.

Many of the above-described features of the TFT array panel shown in FIGS. 3 and 4 may be appropriate to the TFT array panel shown in FIG. 10.

A TFT array panel for an LCD according to another embodiment of the present invention will be described in detail with reference to FIG. 11.

Figure 11:
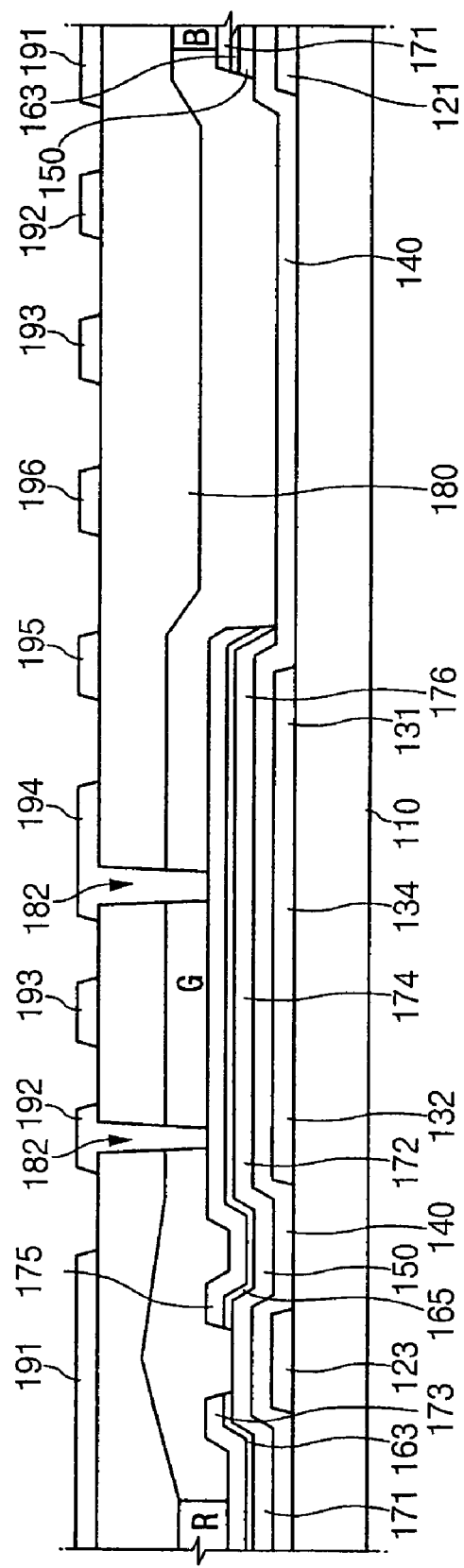
FIG. 11 is a sectional view of an exemplary TFT array panel for an LCD according to another embodiment of the present invention.

FIG. 11 is a sectional view of an exemplary TFT array panel for an LCD according to another embodiment of the present invention.

As shown in FIGS. 11, a layered structure of a TFT array panel of an LCD according to this embodiment is almost the same as that shown in FIG. 4. That is, a plurality of gate lines 121 including a plurality of gate electrodes 123 and a plurality of storage electrodes lines 131 including a plurality of longitudinal branches 132 and expansions 134 are formed on a substrate 110, and a gate insulating layer 140, a plurality of semiconductors 150, and a plurality of ohmic contacts 163 and 165 are sequentially formed thereon. A plurality of data lines 171 including a plurality of source electrodes 173 and a plurality of drain electrodes 175 including a plurality of longitudinal and transverse portions 172 and 176 having expansions 174 are formed on the ohmic contacts 163 and 165, and a plurality of color filters R, G and B and a passivation layer 180 is formed thereon. A plurality of contact holes 182 are provided at the passivation layer 180 and the gate insulating layer 140, and a plurality of pixel electrodes 192 and 194 and a common electrode net including a plurality of common electrodes 191, 193 and 195 are formed on the passivation layer 180.

Different from the TFT array panel shown in FIG. 4, the semiconductors 150 have almost the same planar shapes as the data lines 171 and the drain electrodes 175 as well as the underlying ohmic contacts 163 and 165, except for the semiconductors 150 where TFTs are provided. That is, the semiconductors 150 include some exposed portions, which are not covered with the data lines 171 and the drain electrodes 175, such as portions located between the source electrodes 173 and the drain electrodes 175.

A manufacturing method of the TFT array panel according to an embodiment simultaneously forms the data lines 171, the drain electrodes 175, the semiconductors 151, and the ohmic contacts 161 and 165 using one photolithography process.

A photoresist pattern for the photolithography process has position-dependent thickness, and in particular, it has first and second portions with decreased thickness. The first portions are located on wire areas that will be occupied by the data lines 171 and the drain electrodes 175 and the second portions are located on channel areas of TFTs.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

As a result, the manufacturing process is simplified by omitting a photolithography step.

Many of the above-described features of the TFT array panel shown in FIGS. 3 and 4 may be appropriate to the TFT array panel shown in FIG. 11.

First, an opposite panel for an LCD according to an embodiment of the present invention is now described with reference to FIGS. 12–14.

Figure 12:
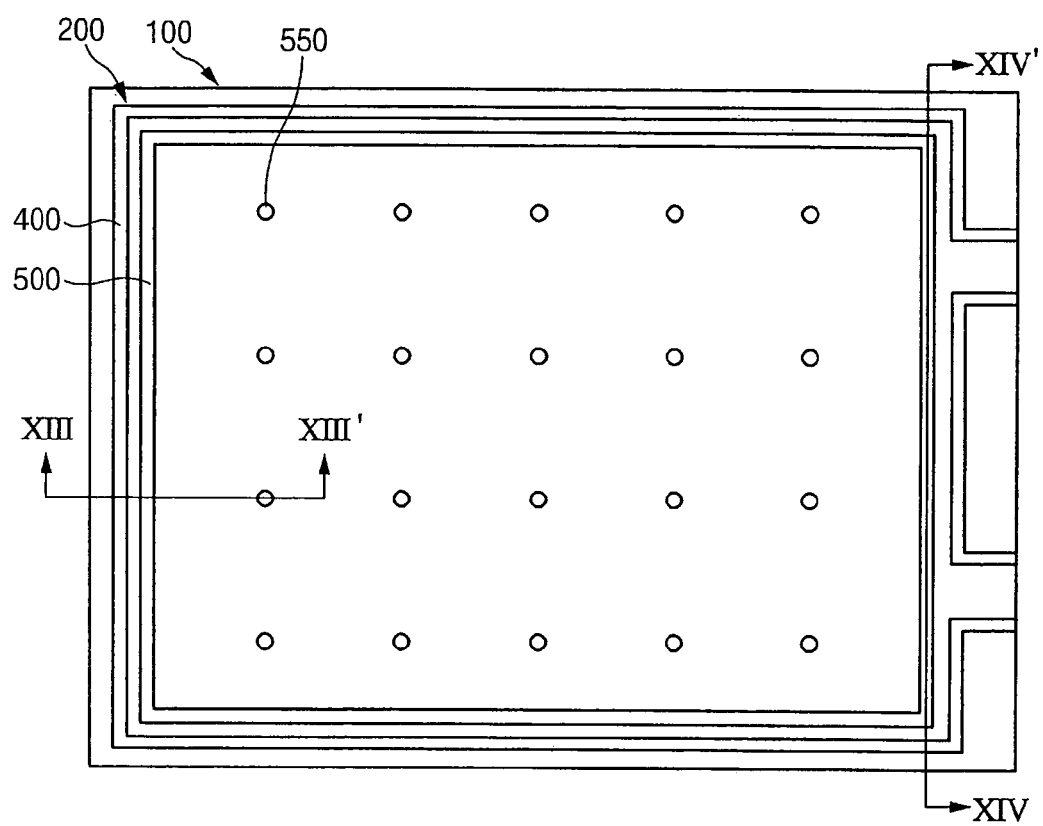
FIG. 12 is a schematic layout view of an LCD according to an embodiment of the present invention.
Figure 13:
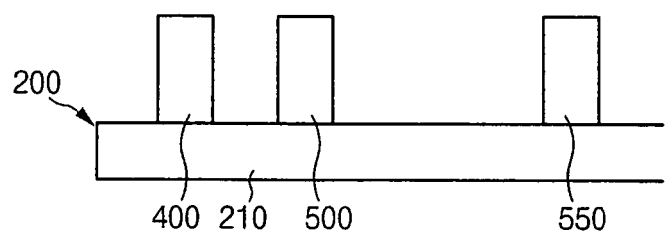
FIGS. 13 and 14 are sectional views of the opposite panel of the LCD shown in FIG. 12 taken along the lines XIII–XIII' and XIV–XIV', respectively.
Figure 14:
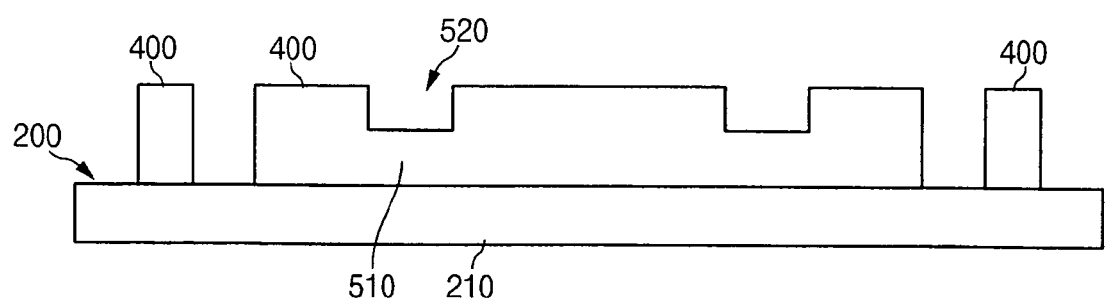

FIG. 12 is a schematic layout view of an LCD according to an embodiment of the present invention, and FIGS. 13 and 14 are sectional views of the opposite panel of the LCD shown in FIG. 12 taken along the lines XIII–XIII' and XIV–XIV', respectively.

Referring to FIGS. 12–14, a sealant 400 for confining a liquid crystal layer, a light blocking layer 500 for blocking light leakage, and a plurality of columnar spacers 550 for sustaining a gap between a TFT array panel 100 and an opposite panel 200 are formed on an insulating substrate 210.

The sealant 400 extends along the boundary of the substrate 210 and has inlets for injecting liquid crystal, which will be sealed after the injection of the liquid crystal.

The light blocking layer 500 and the spacers 550 are preferably made of organic material containing black pigment. However, they may be made of metal or metal oxide.

The light blocking layer 500 is disposed in an area enclosed by the sealant 400 and extends along the sealant to define a display area. The light blocking layer 500 has a plurality of depressions 520 disposed opposite the inlets of the sealant 400 for facilitating the injection of the liquid crystal. The light blocking layer 500 may further have other depressions is disposed opposite the depressions 520.

The spacers 550 are disposed in the display area and regularly distributed. The spacers 550 may have a thickness larger than the light blocking layer 500 in consideration of the height of the elements formed in the TFT array panel 100. In this case, the light blocking layer 500 and the spacers 550 are patterned by using a photo-mask having translucent areas as well as light transmitting transparent areas and light blocking opaque areas. The translucent areas may have a slit pattern, a lattice pattern, a thin film(s) with intermediate transmittance or intermediate thickness. In addition, the depressions 520 may be formed by using the above-described photo-mask.

This structure facilitates the formation of the opposite panel 200 since there is no color filter thereon. In addition, the light blocking layer 500 prevents the liquid crystal from directly contacting the sealant 400, thereby preventing the contamination of the liquid crystal by the sealant 400.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel comprising:
a plurality of gate lines formed on a substrate and including a plurality of oblique portions and a plurality of gate electrodes;
a first insulating layer on the gate line;
a semiconductor layer formed on the first insulating layer;
a plurality of data lines formed at least on the semiconductor layer and intersecting the gate lines to defined trapezoidal pixel areas;
a plurality of drain electrodes separated from the data lines;
a second insulating layer formed at least on portions of the semiconductor layer that are not covered with the data lines and the drain electrodes;
a plurality of pixel electrodes formed on the second insulating layer and connected to the drain electrodes, at least two of the pixel electrodes disposed in each pixel area; and
a plurality of common electrodes formed on the second insulating layer, arranged alternate to the pixel electrodes and connected to the drain electrodes, each common electrode having an edge spaced apart from an edge of the pixel electrodes and substantially parallel to the edge of the pixel electrodes.

2. The thin film transistor array panel of claim 1, wherein the gate lines are curved near boundaries of the pixel areas.

3. The thin film transistor array panel of claim 1, wherein the common electrodes and the pixel electrodes extend substantially parallel to the oblique portions of the gate lines.

4. The thin film transistor array panel of claim 1, further comprising a plurality of storage electrode lines having a plurality of first portions extending substantially parallel to the data lines.

5. The thin film transistor array panel of claim 4, further comprising a plurality of signal lines overlapping the storage electrode lines to form storage capacitors.

6. The thin film transistor array panel of claim 1, wherein the pixel electrodes and the common electrodes comprises transparent material.

7. The thin film transistor array panel of claim 1, further comprising a plurality of color filters disposed under the passivation layer and in the pixel areas.

8. A liquid crystal display comprising:
a first panel;
a second panel facing the first panel; and
a liquid crystal layer interposed between the first panel and the second panel,
wherein the first panel includes:
a plurality of gate lines formed on a substrate and including a plurality of oblique portions and a plurality of gate electrodes;
a first insulating layer on the gate line;
a semiconductor layer formed on the first insulating layer;
a plurality of data lines formed at least on the semiconductor layer and intersecting the gate lines to defined trapezoidal pixel areas;
a plurality of drain electrodes separated from the data lines;
a second insulating layer formed at least on portions of the semiconductor layer that are not covered with the data lines and the drain electrodes;
a plurality of pixel electrodes formed on the second insulating layer and connected to the drain electrodes, at least two of the pixel electrodes disposed in each pixel area; and
a plurality of common electrodes formed on the second insulating layer, arranged alternate to the pixel electrodes and connected to the drain electrodes, each common electrode having an edge spaced apart from an edge of the pixel electrodes and substantially parallel to the edge of the pixel electrodes.

9. The liquid crystal display of claim 8, further comprising a sealant disposed around the second panel and confining the liquid crystal layer.

10. The liquid crystal display of claim 9, further comprising a light blocking member located within the sealant and defining a display area for displaying images.

11. The liquid crystal display of claim 10, wherein the light blocking member comprises organic material and is patterned by photolithography.

12. The liquid crystal display of claim 11, further comprising a plurality of spacers including the same layer as the light blocking member.

13. The liquid crystal display of claim 12, wherein the spacers have a height different from the light blocking member.

14. The liquid crystal display of claim 13, wherein the light blocking member has a plurality of depressions.

* * * * *